(12) United States Patent
Elian et al.

(10) Patent No.: US 9,153,706 B2
(45) Date of Patent: Oct. 6, 2015

(54) FILM-COVERED OPEN-CAVITY SENSOR PACKAGE

(71) Applicant: Infineon Technologies AG, Neubiberg (DE)

(72) Inventors: Klaus Elian, Alteglofsheim (DE); Helmut Wietschorke, Laberweinting (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/900,949

(22) Filed: May 23, 2013

(65) Prior Publication Data

US 2014/0346623 A1 Nov. 27, 2014

(51) Int. Cl.
| | | |
|---|---|---|
| *H01L 21/70* | (2006.01) | |
| *H01L 21/56* | (2006.01) | |
| *H01L 29/84* | (2006.01) | |
| *H01L 23/00* | (2006.01) | |

(52) U.S. Cl.
CPC .............. *H01L 29/84* (2013.01); *H01L 24/97* (2013.01); *H01L 2224/48091* (2013.01); *H01L 2224/48247* (2013.01); *H01L 2224/48465* (2013.01)

(58) Field of Classification Search
CPC ..... H01L 31/0422; H01L 31/048; G01J 1/46; G01J 2005/0081; G01J 3/42; G01J 5/0022; G01J 5/0025; G01J 5/02; G01J 5/0215; G01J 5/04; G01J 5/047; G01J 5/08; G01J 5/08; G01J 5/0809; G01J 5/0818; G01J 5/0843

USPC .................................................. 257/410–420
See application file for complete search history.

(56) References Cited

U.S. PATENT DOCUMENTS

| | | | | |
|---|---|---|---|---|
| 6,011,294 | A * | 1/2000 | Wetzel | 257/434 |
| 7,798,497 | B2 | 9/2010 | Wagner et al. | |
| 2010/0275675 | A1* | 11/2010 | Seppa et al. | 73/24.01 |
| 2010/0295140 | A1* | 11/2010 | Theuss et al. | 257/421 |
| 2011/0241197 | A1* | 10/2011 | Theuss | 257/693 |

OTHER PUBLICATIONS

Feiertag, G et al. "Packaging of MEMS Microphones." Smart Sensors, Actuators, and MEMS IV, Proc. of SPIE vol. 7362 73620D, May 2009, pp. 1-8.

* cited by examiner

*Primary Examiner* — Marcos D. Pizarro
*Assistant Examiner* — Nelson Garces
(74) *Attorney, Agent, or Firm* — Murphy, Bilak & Homiller, PLLC

(57) ABSTRACT

Techniques for covering open-cavity integrated-circuit packages in a batch process are disclosed. In an example method, a plurality of open-cavity packages are molded on a single batch leadframe or substrate, each open-cavity package comprising a floor and a plurality of walls arranged around the floor to form a cavity, each of said the walls having a bottom end adjoining said floor and having a top side opposite the bottom end. At least one semiconductor device is attached to the floor and within the cavity of each of the open-cavity packages, and a single flexible membrane is affixed to the top sides of the walls of the plurality of open-cavity packages, so as to substantially cover all of the cavities. The flexible membrane is then severed, between the packages.

7 Claims, 4 Drawing Sheets

FILM-COVERED OPEN-CAVITY SENSOR PACKAGE

TECHNICAL FIELD

The present application relates to integrated-circuit modules, and in particular to techniques for packaging sensors in open-cavity integrated-circuit packages.

BACKGROUND

In many cases, integrated-circuit devices are embedded in a solid-body package. One popular package, for example, is the plastic quad flat package (QFP), which has so-called gull-wing leads extending from the four sides of the generally planar, rectangular package. With this type of package, an integrated-circuit device is bonded to a package substrate, using an epoxy material. The package substrate may be the die paddle portion of a lead-frame, for example. Wire bonds are attached from bond pads on the device to attachment points on package leads. The device and the package substrate are then over-molded with a plastic molding compound material, which, after curing, forms the plastic package body.

A solid-body packaging approach is not appropriate for some integrated-circuit modules. An integrated-circuit module that includes a pressure sensor or optical sensor, for example, requires the use of an open-cavity package so that environmental pressure or external light sources can reach the device. However, a lid to the package is typically provided, in some cases to protect the interior parts but more generally to provide a surface that can be used by pneumatic pick-and-place machinery during the manufacture of circuit boards or other units that use the packaged devices.

FIG. 1 illustrates examples of open-cavity packages that might be used with a pressure sensor, for example. Package 110 includes a plastic package body 115 and a plastic lid 120 affixed thereto. Plastic lid 120 has a large opening in its center, to allow environmental pressure to reach a pressure sensor inside the package. Package 150 comprises a ceramic package body 155 and a metal lid 160 affixed thereto. Metal lid 160 also has an opening in the center.

During manufacture of packaged devices like those shown in FIG. 1, each lid typically is placed on the package body one at a time, using pneumatic pick-and-place machinery, and glued or welded into place. Improved processes are needed for assembling integrated-circuit modules using open-cavity packages.

SUMMARY

Embodiments of the present invention include integrated-circuit modules and methods for producing such modules. According to an example embodiment, an integrated-circuit module comprises an open-cavity package comprising a floor and a plurality of walls arranged around the floor to form a cavity, each of said walls having a bottom end adjoining said floor and having a top side opposite the bottom end. A semiconductor device is attached to the floor of the open-cavity package, within the cavity, and a flexible membrane is affixed to the top sides of said walls so as to substantially cover the cavity. In some embodiments, the flexible membrane is affixed to the top sides of said walls with an adhesive layer. In some other embodiments, the flexible membrane is laser welded to the top sides of said walls.

In some embodiments, the semiconductor device is a pressure sensor device. In other embodiments, the semiconductor device is an optical sensor device. The flexible membrane may be substantially transparent to said first wavelength, in some of these embodiments.

In some embodiments, the flexible membrane is composed of a material that decomposes at reflow soldering temperatures. In some of these embodiments, the flexible membrane comprises nitrocellulose. In some other embodiments, the flexible membrane is a microporous membrane that permits gases to pass through the membrane but prevents liquids from entering the cavity.

In an example method of fabricating an integrated-circuit module, a plurality of open-cavity packages are molded on a single batch leadframe or substrate, each open-cavity package comprising a floor and a plurality of walls arranged around the floor to form a cavity, each of said the walls having a bottom end adjoining said floor and having a top side opposite the bottom end. At least one semiconductor device is attached to the floor and within the cavity of each of the open-cavity packages, and a single flexible membrane sheet is affixed to the top sides of the walls of the plurality of open-cavity packages, so as to substantially cover all of the cavities. The flexible membrane is then severed, between the packages. For example, this severing may be done by removing the flexible membrane between packages with a laser, or by removing the flexible membrane between packages with a trim and form process that simultaneously cuts a lead frame between the packages.

In some embodiments, each of the packages are subsequently placed on a corresponding circuit board or substrate, using a pneumatic nozzle (often referred to as a "pipette") applied to the flexible membrane covering the cavities of said packages. In some of these embodiments, the flexible membrane is composed of a material that decomposes at reflow soldering temperatures, and the method further includes subjecting the packages to reflow temperatures, so as to attach the packages to the circuit boards or substrates and so as to simultaneously decompose the flexible membrane covering the cavities of said packages.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined, unless they exclude each other. Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top," "bottom," "front," "back,"

"leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with one another, unless specifically noted otherwise or unless such combination is clearly not possible.

Figure 1:
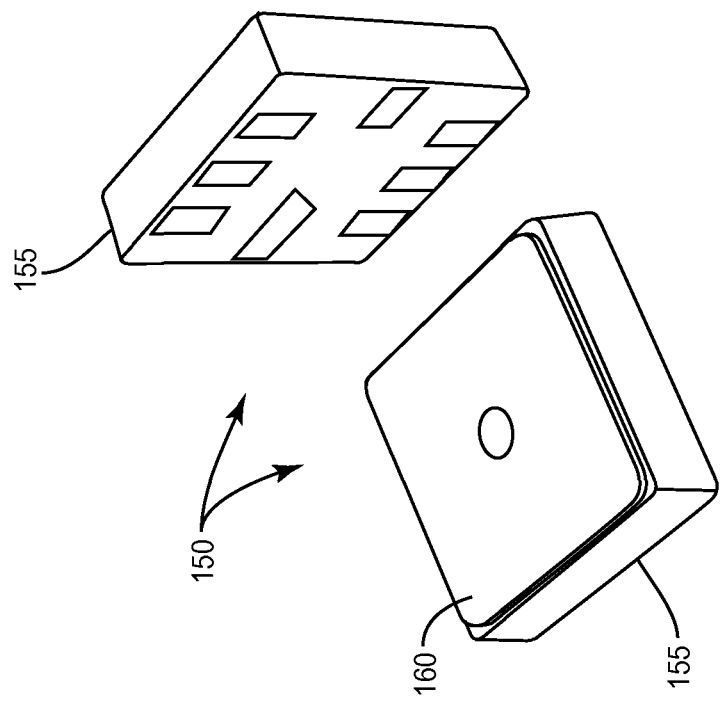
FIG. 1 illustrates examples of open-cavity packages.
Figure 1:
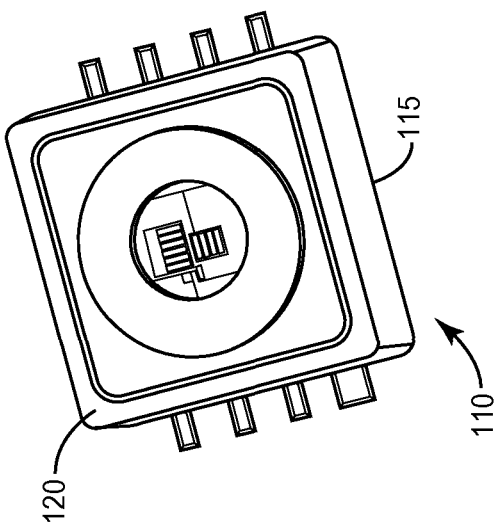

As discussed above, during manufacture of open-cavity packaged devices like those shown in FIG. 1, each lid typically is placed on the package body one at a time, using pneumatic pick-and-place machinery, and glued or welded into place. Because this is generally done serially, this is a time-consuming and expensive process. According to several embodiments of the present invention, many packages can be covered at once, using a membrane that can be glued or laminated to the packages in a batch process. The membrane between the packages can then be cut by laser processes, by example, or by the same trim and form process that is used to cut a batch lead frame between the packages.

In some embodiments, the membrane can be very flexible and glued or welded in place so that it completely seals the open cavity, thus providing environmental protection. Alternatively, the membrane can be relatively stable, e.g., similar in flexibility to thin cardboard.

Figure 2:
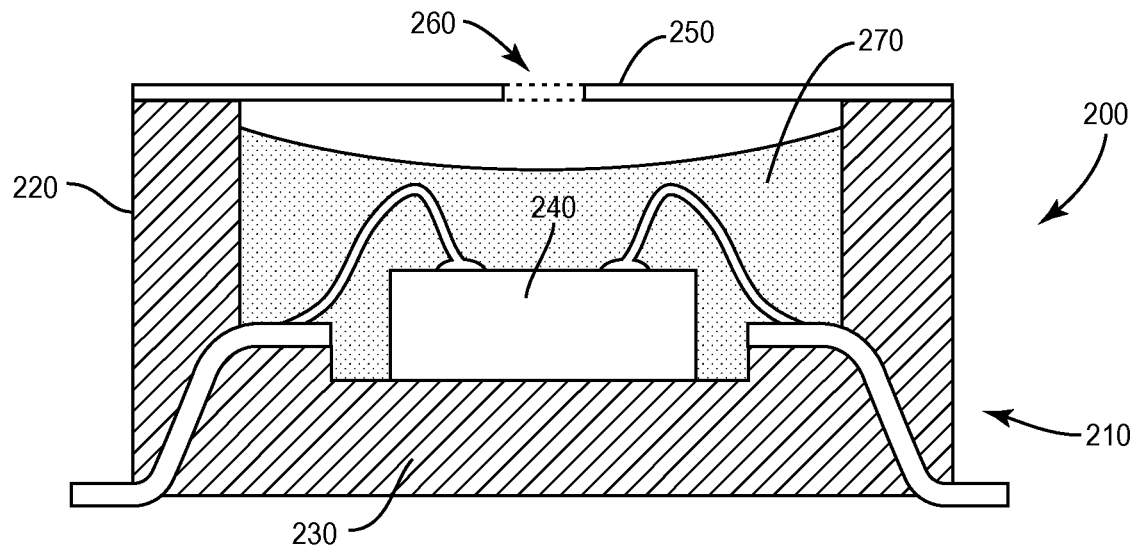
FIG. 2 illustrates an open-cavity package covered with a semi-rigid membrane.

An example of the latter approach is shown in FIG. 2. Integrated-circuit module 200 shows an open-cavity package 210 having a flexible but semi-rigid membrane 250 affixed to the tops of side walls 220 around the floor 230 of the package. The semi-rigid membrane 250 has enough rigidity to maintain its shape even while the module 200 is picked up by the nozzle of a pneumatic pick-and-place machine, but is flexible enough to be deformed by forces that substantially exceed the weight of the module.

An opening 260 in the semi-rigid membrane allows environmental pressure to reach a semiconductor device 240 affixed to the floor of the open-cavity package 240. In some embodiments, semiconductor 240 may be a pressure sensor, for example, or, more generally, a pressure transducer, such as an air-pressure sensor, or an acoustic sensor, speaker, or resonator. In some cases the semiconductor device 240 may be glued directly to the floor of a plastic package body, for example, as shown in the example of FIG. 2. In other cases the semiconductor device 240 may be affixed to a substrate carrying other devices and/or electrical conductors, where the substrate is in turn affixed to a package floor or molded in a package body so as to form a floor. In some cases, the device may be protected by a protection gel 270 that keeps moisture and other contaminants away from the semiconductor device 240 while still allowing pressure forces to act on the sensor.

Figure 3:
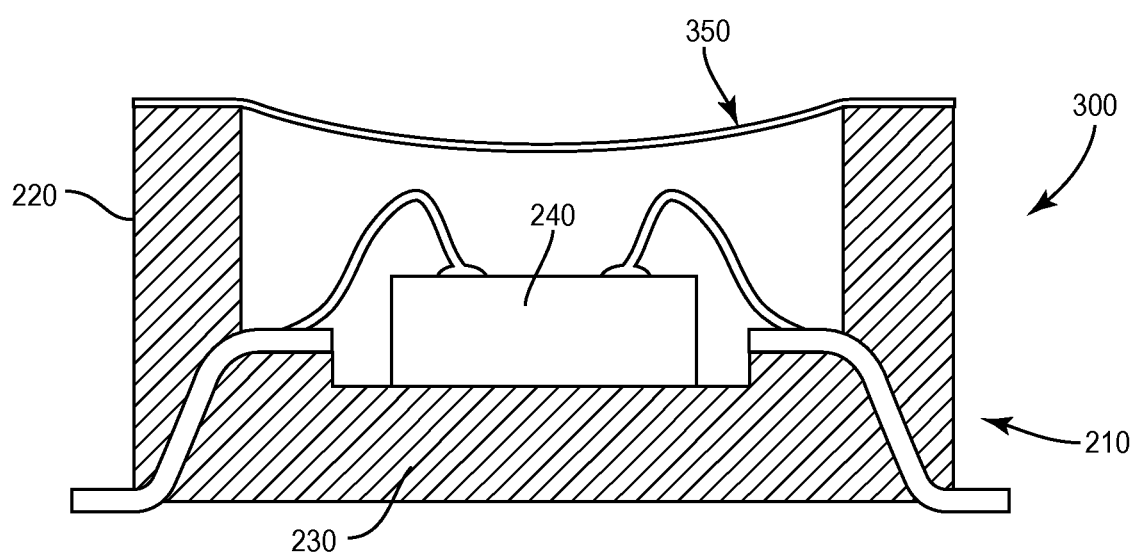
FIG. 3 illustrates an open-cavity package covered with a very flexible membrane.

In other embodiments, the membrane can be quite flexible and completely seal an opening at the top of the package, thus providing some degree of environmental protection, even without the use of a protection gel. An example integrated-circuit module 300 according to this approach is shown in FIG. 3, which shows open-cavity package 210 having a flexible membrane 350 affixed to the tops of side walls 220 around the floor 230 of the package. Again, semiconductor device 240 is affixed to the floor of the open-cavity package 210; in the example shown in FIG. 3 the device is glued directly to the floor of a plastic package body.

The integrated-circuit module 300 in FIG. 3 is sealed with a very thin and flexible membrane 350, with no additional protection provided for the semiconductor device 240. If the semiconductor device 240 is a pressure sensor, however, this approach may limit the sensor's ability to track environmental pressures, although it may be effective in relatively high-pressure applications, such as in pressure sensors used to measure pressures inside truck tires, where pressures may exceed 4 bars.

One variant of this approach that at least partly this limitation is particularly effective in scenarios where rapid changes in pressure are not expected. In these applications, the flexible membrane may be a microporous membrane that permits gases to pass through the membrane but prevents liquids and other contaminants from entering the cavity. An example material for such a Goretex® membrane manufactured by W. L. Gore for use in venting headlight assemblies. Hydrophobic membranes, which are water-resistant, are available, as are oleophobic membranes, which restrict the flow of oily fluids, detergents, alcohols, and the like. In some embodiments, such as in applications where the semiconductor device 240 is a gas sensor, the membrane may be selected to be a gas-selective vent, so that only a particular class of gases are able to penetrate the membrane to reach the sensor.

The embodiment illustrated in FIG. 3 may also be suitable in applications where devices other than pressure sensors are used. For example, in some embodiments semiconductor device 240 may be an optical sensor adapted to detect light of at least a first wavelength. Examples include a camera chip or systems having integrated photovoltaic cells. In some of these embodiments, the flexible membrane 350 may be selected so that is substantially transparent to at least this first wavelength, so that the optical sensor is operative even with the flexible membrane 350 in place.

In some applications, it may be desirable to have a "lid" on an open-cavity package only up until the time the integrated-circuit module is installed on a circuit board on in an electronic device, after which it would be preferred to not have any type of lid or seal in place. This approach may be desirable, for example, when the integrated-circuit includes an optical sensor. Having the lid in place until the integrated-circuit module is installed provides protection for the semiconductor device(s) in the module, and also provides a surface that a pneumatic pick-and-place machine can use to place the integrated-circuit module on a circuit board or other substrate for soldering in place. However, after the integrated-circuit module is installed, the lid may interfere with the semiconductor device's operation.

One solution to this problem is to seal the open-cavity package with a flexible membrane that is designed to decompose during a solder reflow process. A flexible membrane seal according to this approach is stable at normal room and factory temperatures (e.g., between 50 and 120 degrees Fahrenheit), but decomposes rapidly at the temperatures experienced during solder reflow, e.g., above several hundred degrees Fahrenheit. In some embodiments, the flexible membrane can be composed at least partly of a nitrocellulose material, like the material used as the base for photographic, X-ray, and motion picture films in the late 19$^{th}$ and early 20$^{th}$ centuries. A suitable nitrocellulose flexible membrane would be stable at room temperatures, but would spontaneously combust at solder reflow temperatures. Devices sealed with such a membrane thus remain sealed during shipment to an assembler and during the pick-and-place phase of the circuit board assembly. The membrane spontaneously combusts during the reflow process, exposing the semiconductor device(s) inside to atmospheric pressure and/or light. Note that viscous protection gels may be used to provide some protection of the semiconductor devices, in some embodiments.

Figure 4:
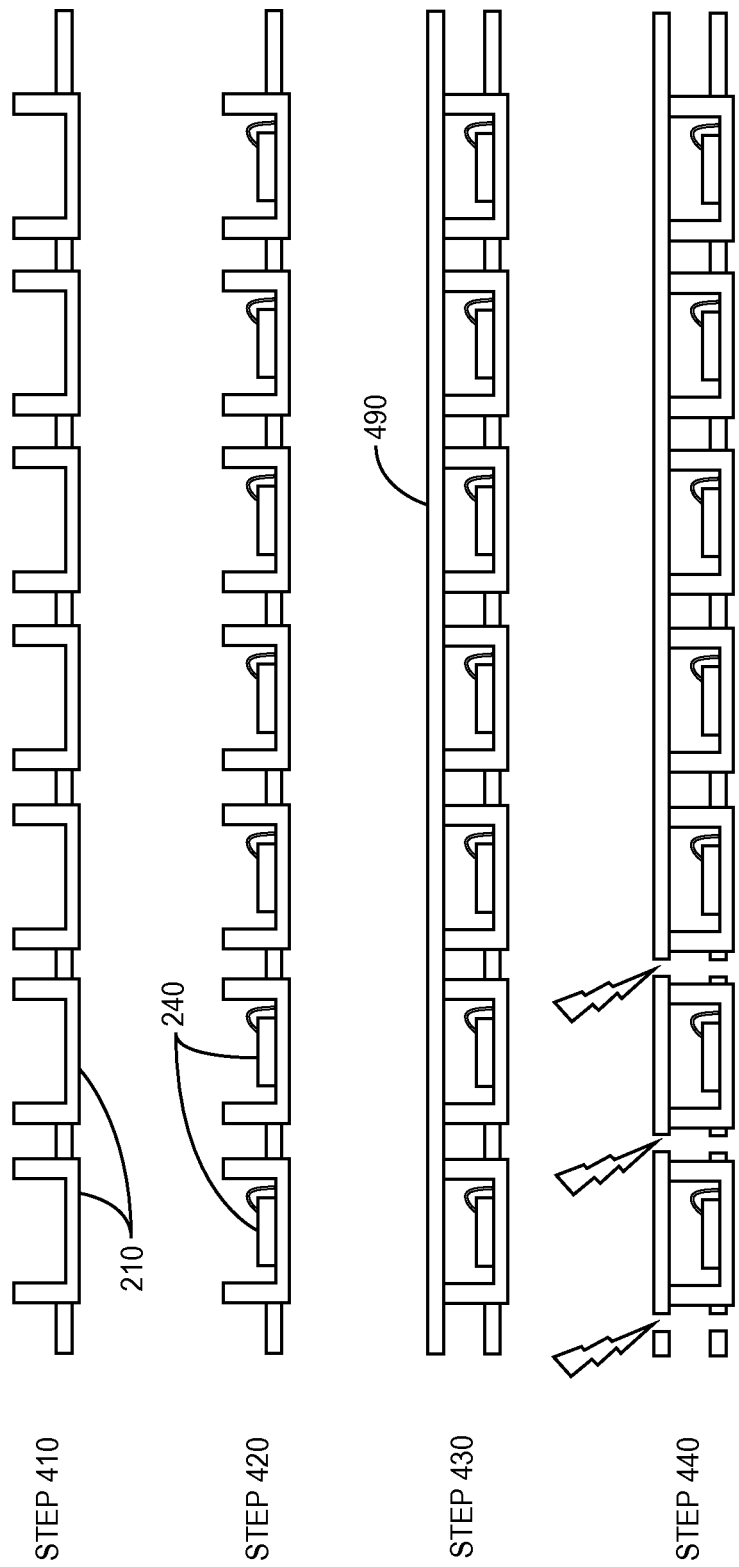
FIG. 4 illustrates a process for assembling integrated-circuit modules using a flexible membrane sheet.

FIG. 4 illustrates features of an example process for assembling integrated-circuit modules using any of the flexible membranes discussed. As shown at step 410, open-cavity packages 210 (leaded or non-leaded) are molded on a batch subframe or a related substrate. Only a cross-section view, with seven package bodies, is shown in FIG. 4; it will be appreciated that the batch leadframe may extend in two dimensions, allowing for the fabrication of a rectangular array of package bodies.

As seen at step 420, semiconductor devices 240 are integrated into the packages, e.g., using a die and wire-bond process, or a flipchip process. As shown at step 430, a single membrane sheet 490 is laminated, glued, laser welded, embossed, or otherwise affixed to the tops of the side walls of the packages 210, in a single batch process. Finally, as shown at step 440, the membrane between the packages 210 is severed. This may be done, for example, using a laser cutting process, or using the same trim and form process that is used to cut the leadframe between the packages.

Figure 5:
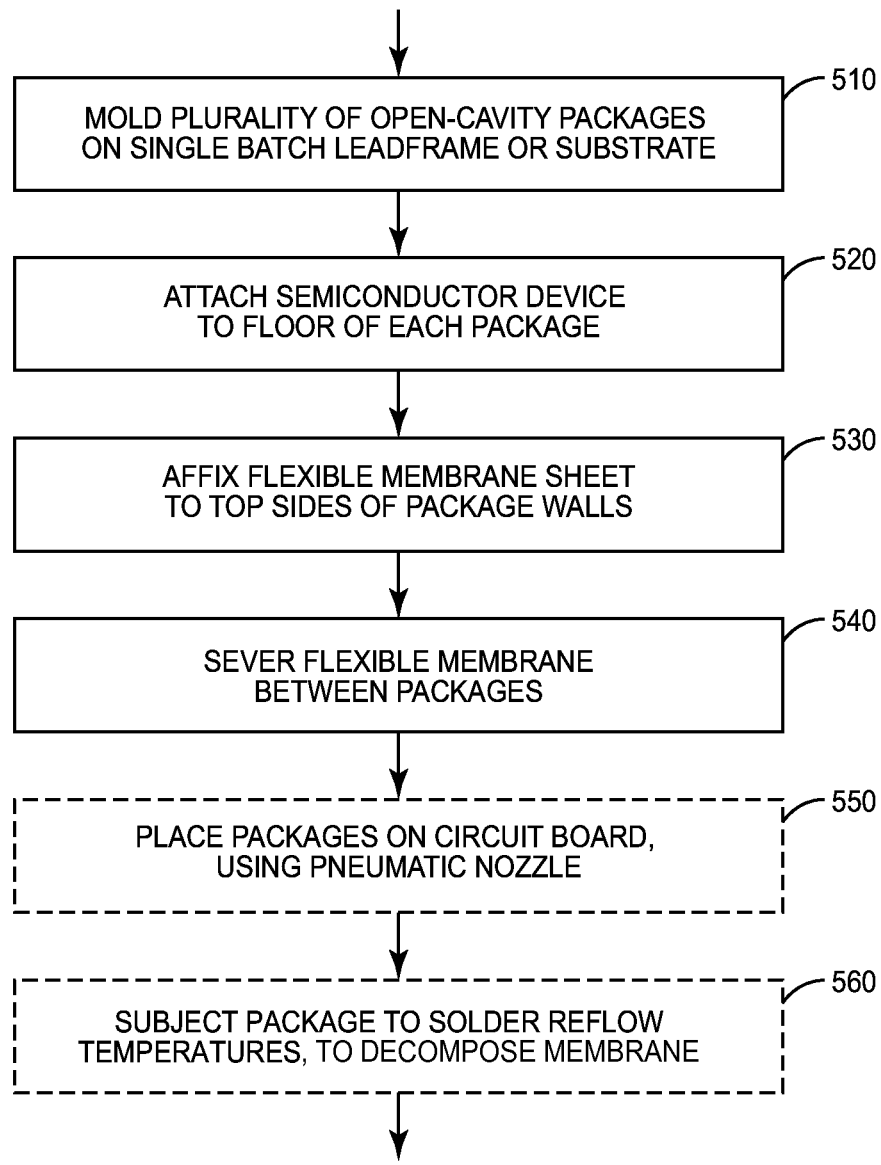
FIG. 5 is a process flow diagram illustrating a process for assembling integrated-circuit modules.

FIG. 5 is a process flow diagram illustrating the process of FIG. 4 more generally. As shown at block 510, a plurality of open-cavity packages are molded on a single batch leadframe or substrate, each open-cavity package comprising a floor and a plurality of walls arranged around the floor to form a cavity, each of said walls having a bottom end adjoining said floor and having a top side opposite the bottom end. As shown at block 520, at least one semiconductor device is attached to the floor and within the cavity of each of the open-cavity packages. A single flexible membrane sheet is then affixed to the top sides of the walls of the plurality of open-cavity packages, so as to substantially cover all of the cavities, as shown at block 530. 16. This may be done using an adhesive, for example, or by laser welding the flexible membrane sheet to the top sides of said walls.

Next, as shown at block 540, the flexible membrane between the packages is severed. In some embodiments, severing the flexible membrane between the packages comprises removing the flexible membrane between packages with a laser. In some other embodiments, severing the flexible membrane between the packages comprises removing the flexible membrane between packages with a trim and form process that simultaneously cuts a lead frame between the packages.

In some embodiments, the operations shown at blocks 510-540 are followed by a pick-and-place process, as shown at block 550, whereby each of the packages are placed on a corresponding circuit board or substrate, using pneumatic nozzles applied to the flexible membrane covering the cavities of said packages. This pick-and-place operation may be followed by a solder reflow operation, as shown at block 560. In some embodiments, as discussed above, the flexible membrane may be composed of a material (e.g., nitrocellulose) that decomposes at reflow soldering temperatures, in which the solder reflow process is operative to simultaneously attach the packages to the circuit boards or other substrates and to decompose the flexible membrane covering the cavities of said packages. It should be appreciated that the pick-and-place and solder reflow operations shown at blocks 550 and 560 may performed by a different entity and/or at a different location than the assembly operations shown in blocks 510-540, and in some cases may not be performed at all. Accordingly, blocks 550 and 560 are shown with a dashed outline indicating that these operations are "optional," in the sense that the illustrated operations may not appear in all embodiments or in every instance of the illustrated method.

The processes shown in FIGS. 4 and 5 may be applied to a variety of integrated-circuit modules containing any of a variety of types of semiconductor device. As discussed above, in some cases the semiconductor device in each package is a pressure sensor device. In some embodiments, the semiconductor device is an optical sensor device adapted to detect light at a first wavelength. In some of these embodiments, the flexible membrane is substantially transparent to said first wavelength, so that the sensor remains operational with the flexible membrane in place.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. The description of various techniques provided herein is intended to cover any adaptations or variations of the specific embodiments discussed herein. Therefore, it is intended that the present invention be limited only by the claims attached hereto and the equivalents thereof.

What is claimed is:

1. An integrated-circuit module, comprising:
    an open-cavity package comprising a floor and a plurality of walls arranged around the floor to form a cavity, each of said walls having a bottom end adjoining said floor and having a top side opposite the bottom end;
    a semiconductor device attached to the floor of the open-cavity package, within the cavity; and
    a flexible membrane affixed to the top sides of said walls so as to substantially cover the cavity,
    wherein the flexible membrane comprises nitrocellulose.

2. The integrated-circuit module of claim 1, wherein the semiconductor device is a pressure sensor device.

3. The integrated-circuit module of claim 1, wherein the semiconductor device is an optical sensor device adapted to detect light at a first wavelength.

4. The integrated-circuit module of claim 3, wherein said flexible membrane is substantially transparent to said first wavelength.

5. The integrated-circuit module of claim 1, wherein said flexible membrane is affixed to the top sides of said walls with an adhesive layer.

6. The integrated-circuit module of claim 1, wherein said flexible membrane is laser welded to the top sides of said walls.

7. The integrated-circuit module of claim 1, wherein said flexible membrane is a microporous membrane that permits gases to pass through the membrane but prevents liquids from entering the cavity.

* * * * *

UNITED STATES PATENT AND TRADEMARK OFFICE
CERTIFICATE OF CORRECTION

| | | |
|---|---|---|
| PATENT NO. | : 9,153,706 B2 | Page 1 of 1 |
| APPLICATION NO. | : 13/900949 | |
| DATED | : October 6, 2015 | |
| INVENTOR(S) | : K. Elian et al. | |

It is certified that error appears in the above-identified patent and that said Letters Patent is hereby corrected as shown below:

Title Page

Abstract, line 6, please change "of said the walls" to -- of said walls --

Abstract, line 13, please change "then severed, between" to -- then severed between --

Signed and Sealed this
Fifth Day of April, 2016

Michelle K. Lee
*Director of the United States Patent and Trademark Office*